United States Patent [19]
Christopher et al.

[11] Patent Number: 4,507,725
[45] Date of Patent: Mar. 26, 1985

[54] DIGITAL FILTER OVERFLOW SENSOR

[75] Inventors: Lauren A. Christopher, Weedsport, N.Y.; David L. Sprague, Plainsboro, N.J.

[73] Assignee: RCA Corporation, New York, N.Y.

[21] Appl. No.: 394,326

[22] Filed: Jul. 1, 1982

[51] Int. Cl.³ .......................... G06F 7/38; H03H 7/28
[52] U.S. Cl. ................................... 364/724; 364/745; 333/168
[58] Field of Search ....................... 364/724, 745, 825; 333/168; 328/167; 377/27, 51

[56] References Cited

U.S. PATENT DOCUMENTS

| | | | |
|---|---|---|---|
| 3,665,171 | 5/1972 | Morrow | 364/724 |
| 3,725,687 | 4/1973 | Heightley | 235/164 |
| 3,749,895 | 7/1973 | Kao | 235/152 |
| 4,215,415 | 7/1980 | Kanemasa et al. | 364/724 |
| 4,223,389 | 9/1980 | Amada et al. | 364/724 |
| 4,305,133 | 12/1981 | Amada et al. | 364/724 |
| 4,379,338 | 4/1983 | Nishitani et al. | 364/745 |

OTHER PUBLICATIONS

S. L. Freeny, "Special Purpose Hardware for Digital Filtering" Proc. of IEEE, vol. 63, No. 4, Apr. 1975, pp. 633–648.

L. B. Jackson et al., "An Approach to the Implementation of Digital Filters," IEEE Trans. Audio Electroacoust., vol. AU-16, pp. 413–421, Sep. 1968.

Primary Examiner—James D. Thomas
Assistant Examiner—Dale M. Shaw
Attorney, Agent, or Firm—E. M. Whitacre; P. J. Rasmussen; E. P. Herrmann

[57] ABSTRACT

A sampled data FIR filter of the type including alternately connected ADDER circuits and delay stages in a serial chain where input samples are multiplied by coefficients and applied in parallel to the ADDER circuits for addition to partial sums therein has respective COUNTER circuits coupled to each ADDER circuit to respond to sum overflows. The COUNTER circuits are serially connected one to another by delay stages. The overflow count corresponding to each signal sample is translated to successive counter in consonance with such partial sum being translated from ADDER circuit to ADDER circuit. The last COUNTER circuit contains the net number of overflows corresponding to the output sum, which overflow signal is indicative of the state of correctness of the output sample.

7 Claims, 5 Drawing Figures

|  | PRESET | | | | $\overline{U}$ | | | | U | | | |
|---|---|---|---|---|---|---|---|---|---|---|---|---|
| C | C4 | C3 | C2 | C1 | C40 | C30 | C20 | C10 | C40 | C30 | C20 | C10 |
| 0 | 0 | 0 | 0 | 0 | 0 | 0 | 0 | 0 | 0 | 0 | 0 | 0 |
| 0 | 0 | 0 | 0 | 1 | 0 | 0 | 0 | 1 | 0 | 0 | 0 | 1 |
| 0 | 0 | 0 | 1 | 0 | 0 | 0 | 1 | 0 | 0 | 0 | 1 | 0 |
| 0 | 0 | 0 | 1 | 1 | 0 | 0 | 1 | 1 | 0 | 0 | 1 | 1 |
| 0 | 0 | 1 | 0 | 0 | 0 | 1 | 0 | 0 | 0 | 1 | 0 | 0 |
| 0 | 0 | 1 | 0 | 1 | 0 | 1 | 0 | 1 | 0 | 1 | 0 | 1 |
| 0 | 0 | 1 | 1 | 0 | 0 | 1 | 1 | 0 | 0 | 1 | 1 | 0 |
| 0 | 0 | 1 | 1 | 1 | 0 | 1 | 1 | 1 | 0 | 1 | 1 | 1 |
| 0 | 1 | 0 | 0 | 0 | 1 | 0 | 0 | 0 | 1 | 0 | 0 | 0 |
| 0 | 1 | 0 | 0 | 1 | 1 | 0 | 0 | 1 | 1 | 0 | 0 | 1 |
| 0 | 1 | 0 | 1 | 0 | 1 | 0 | 1 | 0 | 1 | 0 | 1 | 0 |
| 0 | 1 | 0 | 1 | 1 | 1 | 0 | 1 | 1 | 1 | 0 | 1 | 1 |
| 0 | 1 | 1 | 0 | 0 | 1 | 1 | 0 | 0 | 1 | 1 | 0 | 0 |
| 0 | 1 | 1 | 0 | 1 | 1 | 1 | 0 | 1 | 1 | 1 | 0 | 1 |
| 0 | 1 | 1 | 1 | 0 | 1 | 1 | 1 | 0 | 1 | 1 | 1 | 0 |
| 0 | 1 | 1 | 1 | 1 | 1 | 1 | 1 | 1 | 1 | 1 | 1 | 1 |
| 1 | 0 | 0 | 0 | 0 | 0 | 0 | 0 | 1 | 1 | 1 | 1 | 1 |
| 1 | 0 | 0 | 0 | 1 | 0 | 0 | 1 | 0 | 0 | 0 | 0 | 0 |
| 1 | 0 | 0 | 1 | 0 | 0 | 0 | 1 | 1 | 0 | 0 | 0 | 1 |
| 1 | 0 | 0 | 1 | 1 | 0 | 1 | 0 | 0 | 0 | 0 | 1 | 0 |
| 1 | 0 | 1 | 0 | 0 | 0 | 1 | 0 | 1 | 0 | 0 | 1 | 1 |
| 1 | 0 | 1 | 0 | 1 | 0 | 1 | 1 | 0 | 0 | 1 | 0 | 0 |
| 1 | 0 | 1 | 1 | 0 | 0 | 1 | 1 | 1 | 0 | 1 | 0 | 1 |
| 1 | 0 | 1 | 1 | 1 | 1 | 0 | 0 | 0 | 0 | 1 | 1 | 0 |
| 1 | 1 | 0 | 0 | 0 | 1 | 0 | 0 | 1 | 0 | 1 | 1 | 1 |
| 1 | 1 | 0 | 0 | 1 | 1 | 0 | 1 | 0 | 1 | 0 | 0 | 0 |
| 1 | 1 | 0 | 1 | 0 | 1 | 0 | 1 | 1 | 1 | 0 | 0 | 1 |
| 1 | 1 | 0 | 1 | 1 | 1 | 1 | 0 | 0 | 1 | 0 | 1 | 0 |
| 1 | 1 | 1 | 0 | 0 | 1 | 1 | 0 | 1 | 1 | 0 | 1 | 1 |
| 1 | 1 | 1 | 0 | 1 | 1 | 1 | 1 | 0 | 1 | 1 | 0 | 0 |
| 1 | 1 | 1 | 1 | 0 | 1 | 1 | 1 | 1 | 1 | 1 | 0 | 1 |
| 1 | 1 | 1 | 1 | 1 | 0 | 0 | 0 | 0 | 1 | 1 | 1 | 0 |

COUNT UP — COUNT DOWN

*Fig. 3*

DIGITAL FILTER OVERFLOW SENSOR

This invention relates to digital filters and more particularly to overflow control for a finite impulse response, or FIR, non recursive digital filter.

The class of non recursive FIR filters considered is generally specified by the linear constant-coefficient equation $$y_n = \sum_k a_k x_{n-k}$$

where $(x_n)$ is the input sequence and $y_n$ is the output sequence. The equation implies the addition of a number of terms and FIR filters perform explicitly that function. For instance, the input sequence $x_n$ is applied to a number of coefficient multipliers $a_k$, the products $a_k x_n$ of which are then inputted as addends to ADDER circuits. The augends for the ADDER circuits are partial sums formed from prior additions by the circuitry and stored for one or more periods of the input sequence.

The filter response is tailored simply by changing the number and value of the coefficient multipliers. The accuracy to which the desired response can be achieved is limited substantially only by the resolution of the input sequence and the capacity of the filter hardware elements. It will readily be appreciated that the filter function can be implemented on a general purpose computer, though the computer may not be capable of operating on the input signal in real time. For many applications where it may be desirable to implement the filter function by digital techniques, it may not be practical or possible to incorporate a computer. Thus stand alone FIR filters have been developed as circuit device manufacturing techniques advanced to the point where substantial portions of the requisite circuitry could be integrated into cost-effective components. The stand-alone filters generally sacrifice computational accuracy in order to achieve real time processing and minimize parts count. This is effected by (a) quantizing the bit length of the signal samples x to the minimum commensurate with acceptable signal-to-noise requirements and dynamic range and (b), using ADDERs having a number of bit positions insufficient to output the possible maximum (minimum) partial sums that may occur. When the latter condition occurs the ADDER produces an overflow. Overflows are indicative that the particular sum produced by a particular ADDER is in error and corrective action is required. Heretofore such corrective action has generally taken the form of setting the erroneous sum to one of several alternative predetermined values to tend to reduce the ultimate manifestation of such errors. This correction has commonly been performed at the instant the error is detected.

Consider a digital FIR filter of the type having the input signal $x_n$ coupled to a plurality of coefficient multipliers, the output products of which are coupled as addends to a like plurality of ADDER circuits. The augends for the respective ADDER circuits are derived from the sums, delayed in time, of others of the plurality of ADDERs arranged in a serial chain (FIG. 1). The present inventors realized that in this configuration, overflows of a particular ADDER may not in fact result in an erroneous filter response. Because the ADDERs can overflow in both the positive and negative direction (two's complement arithmetic) only the net overflow relative to each processed sample when it exits the filter is of importance. Corrective procedures need only be applied with respect to the output sum.

SUMMARY OF THE INVENTION

The present invention is an FIR digital filter including a plurality of two's complement ADDER circuits serially connected via delay elements. The addends to respective ones of the ADDER circuits are produced by respective ones of coefficient multipliers to which the input signal is applied. The augends to respective ones of the ADDER circuits are the output SUMS of respective preceding ADDER circuits in the serial chain. Each ADDER circuit in addition to an output SUM generates a "sign" and a "carry-out" signal indicative of an overflow condition and whether or not the overflow is positive or negative.

An up/down COUNTER circuit is coupled to each ADDER circuit. The respective COUNTER circuits increment or decrement a number responsive to the "carry-out" (overflow) signal from the respective ADDER circuit and to the "sign" bit of the particular SUM.

The COUNTER circuits are serially connected via delay elements which correspond to respective delay elements serially connecting the ADDER circuits. Each successive COUNTER is set to a preset count by the resultant count (number) in the preceding COUNTER circuit in the serial chain after the processing of each signal sample. The contents of the respective COUNTER circuits are the cumulative sums of the overflows corresponding to the signal sample currently in the respective ADDER circuit. The last COUNTER circuit in the serial chain contains the net overflow associated with the signal sample in the lastmost ADDER circuit in the serial chain and thereby the output sample. When the lastmost COUNTER contains a nonzero count, corrective action is taken with respect to the corresponding output sample only. This arrangement precludes taking corrective action on partial SUMS and possibly introducing system errors which may not otherwise have occurred.

BRIEF DESCRIPTION OF THE DRAWINGS

FIG. 3 is a state table defining the operation of the FIG. 2 circuit; and

DETAILED DESCRIPTION OF THE INVENTION

The present invention will be described in terms of the non-recursive filter illustrated in FIG. 1 but it should be understood to have general application to recursive and combined recursive and non recursive filters as well.

Figure 1:
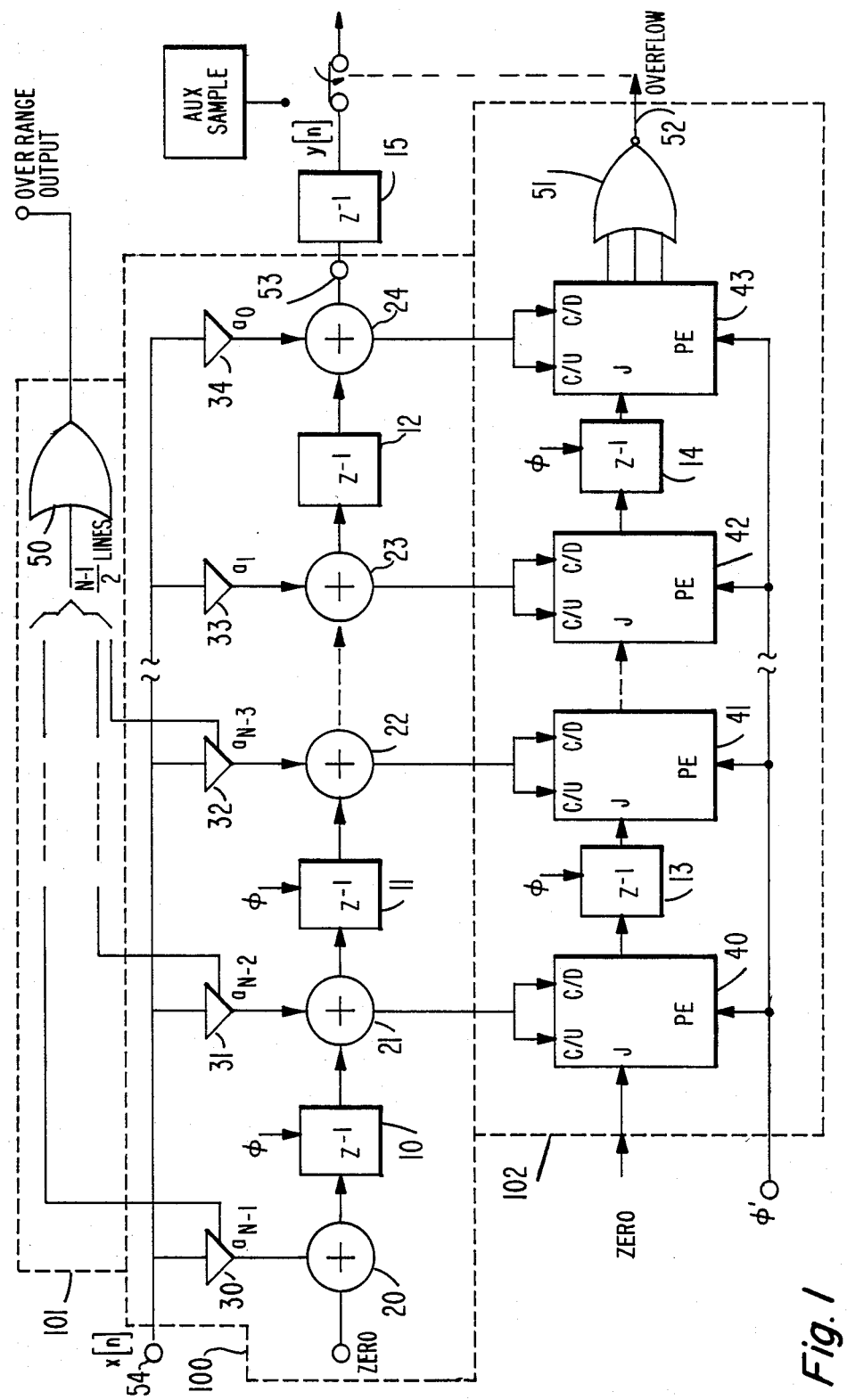
FIG. 1 is a block diagram of a non recursive digital filter embodying the present invention.

Referring to FIG. 1, the elements circumscribed by the broken line 100 illustrate generally a conventional non-recursive sample data FIR filter. Input samples $x_n$ applied to terminal 54 are multiplied by the coefficients $a_i$ in MULTIPLIER circuits 30-34. The samples $a_i x_n$ are applied as addends to respective ADDER circuits 20-24. Output SUMS from the ADDER circuits 20-23 are applied as input samples to delay elements 10-12 respectively and the output SUM of ADDER circuit 24 produces the filter output samples $y_n$. The sums $y_n$ are successively latched into circuit 15 which holds each output sample for a sample period so that it can be accessed by successive processing circuitry in the system. The filter response is defined by the relation $$y_n = \sum_{k=0}^{N-1} a_k x_{n-k} \quad (1)$$

where N is the number of delay elements employed in the filter.

The input samples may be in the form of either parallel bit streams or serial bit streams with the circuit elements selected accordingly. For example, if the filter is to process input samples which are in a parallel bit stream format the delay elements 10-12 will each consist of w parallel delay devices where w is the number of bits per input sample. On the other hand if the circuit is to process input samples applied as serial bit streams, each delay device will consist of at least w serially connected delay stages. These variations however are known to those skilled in the art of sampled data filter design. (See for example S. L. Freeny, "Special-Purpose Hardware for Digital Filtering", Proc. of IEEE, Vol. 63, No. 4, 1975, pp. 633-648). From the foregoing it will readily be appreciated that the invention described herein is applicable to filters which process signals formatted in serial bit streams or filters which process signals formatted in parallel bit streams.

The coefficient MULTIPLIER circuits are commonly realized by circuitry which performs successive shift and add operations, the number of additions being determined by the coefficient. The product is therefore in reality a sum and may include an "overflow bit", the overflow bit being the sign—exclusive OR—carry out and herinafter referred to as simply the "carry bit". The occurrence of a "carry bit" indicates that the product surpasses the range of the multiplier. It is advantageous to moniter the "carry bits" of the respective MULTIPLIER circuits for the purpose of adjusting the input range of the signal samples $x_n$ to preclude saturation of the MULTIPLIER.

The circuit circumscribed by broken line 101 detects the occurrence of MULTIPLIER overflow. In the circuit the "carry bits" of respective ones of MULTIPLIER circuits 30-34 are applied to OR gate 50 which produces an overflow detected signal for the occurrence of a "carry bit" from any one of the respective ones of the MULTIPLIERS. A little reflection will convince one that the overflow detection can be implemented in a type of automatic gain control arrangement operating on the input signal. For example if the digital signal being processed is derived from an analog signal which is converted to digital format by an analog-to-digital converter, the overflow detection signal may be applied to control the gain of an analog variable gain amplifier to precondition the amplitude of the analog signal before application to the analog-to-digital converter.

Since all of the multipliers operate in parallel, simultaneously on the same signal, a more rudimentary arrangement need only moniter the multiplier having the largest coefficient. A more sophisticated arrangement may moniter a plurality of the "carry bits" to produce a variable output proportional to the number of MULTIPLIERS simultaneously producing a carry out.

It will be noted that in the circuit arrangement illustrated in FIG. 1, only $(N-1)/2$ or $\frac{1}{2}$ of the MULTIPLIER "carry bits" are monitered. This arises from the presumption that the coefficient values are symmetric about the filter midpoint, i.e., $a_0 = a_{N-1}$, $a_1 = a_{N-2}$ etc. Thus where such symmetry is present, a savings in hardware can be realized.

The input samples $x_n$ are presumed to be in two's complement format as are the products $x_n a_i$ (though a corresponding arrangement may be designed utilizing "sign"+"magnitude" sample format). The ADDER circuits 20-24 perform two's complement arithmetic. The leftmost ADDER circuit 20 which adds zero to the product $x_n a_{N-1}$ is included in the drawing only for generality and may be eliminated in the present filter. In certain applications, however, it may be desirable to include ADDER 20, for example, to equalize sample processing delays.

Each adder is designed to produce a SUM, a "sign" signal, e.g., the MSB of the signal sample, and a "carry out" signal hereinafter denoted as the "count" signal. The "sign" and count signals are applied to COUNTER circuits 40-43 to compute the net positive and negative overflows associated with each sample as is it processed from leftmost ADDER circuit 20 to the output ADDER circuit 24. For purposes of illustration the "sign" and count signals are converted to count up (C/U) and count down (C/D) signals for application to conventional presettable COUNTER circuits such as the RCA Corp. CD40193 CMOS integrated circuit. The conversion may be accomplished by the circuitry illustrated in FIG. 4A which will be described hereinafter.

Each COUNTER circuit 40-43 has a set of "jam" inputs J from which a predetermined binary number can be preset in the counter responsive to a pulse applied to a preset enable (PE) terminal. The COUNTER circuit will thereafter count up or count down from the preset value responsive to the C/U and C/D signals respectively. Nominally in most applications no more than one count pulse will be available from any one ADDER per sample period. Thus the COUNTER circuit can be designed to simply increment or decrement a preset number by 1 (base 2) responsive to the count signals. Each COUNTER circuit produces a binary output signal equal to the preset value incremented or decremented in accordance with the C/U or C/D signal from the respective adder. Each output count is applied to respective delay elements 13-14 synchronously with the respective sums from ADDERs 21-23 being applied to delay elements 11-12. The delay period associated with each delay element 13-14 is equal in duration to respective ones of the delay elements 11-12 so that respective counts corresponding to particular signal SUMS arrive at successive COUNTER circuits simultaneously with the corresponding signal SUMS arriving at successive ADDER circuits.

The leftmost or first COUNTER circuit 40 is preset for example with a count of zero. Thus if the number of positive and negative overflows attendant a particular sum, as it is processed through the filter, are equal, the count in the rightmost or last COUNTER circuit 43 corresponding to that particular sum will be zero. The resultant count or binary number present in COUNTER circuit 43 is monitered by NOR gate 51 which produces an output signal only for the count being zero. The output signal from NOR gate 51 may be employed to selectively gate the correct resultant sum to further processing circuitry, or upon the occurrence of a non zero net overflow to substitute a predetermined value for the corresponding erroneous sum.

The COUNTER circuits are shown as like devices in FIG. 1. However, it should be readily appreciated that the maximum possible number of overflows, positive or negative, increases as the processed sums proceed from left to right in the circuit. Thus the leftmost counters can be designed to have fewer "count" bit positions than the rightmost COUNTER circuits to economize on circuit hardware.

The preset enable pulse $\phi'$ applied to the counters must be timed to preset the delayed counts (numbers) in the respective COUNTERS prior to the occurrence of a C/U or C/D signal. Since the respective sums and overflow counts are simultaneously applied to the ADDER and COUNTER circuits, and a finite time is required for the ADDER circuits to add the next successive samples $x_n$ $a_i$ to the partial sums stored in the delay elements, there is ample time to perform the preset function. Thus the preset pulse $\phi'$ may be generated by simply delaying the system clock $\phi$.

Figure 2:
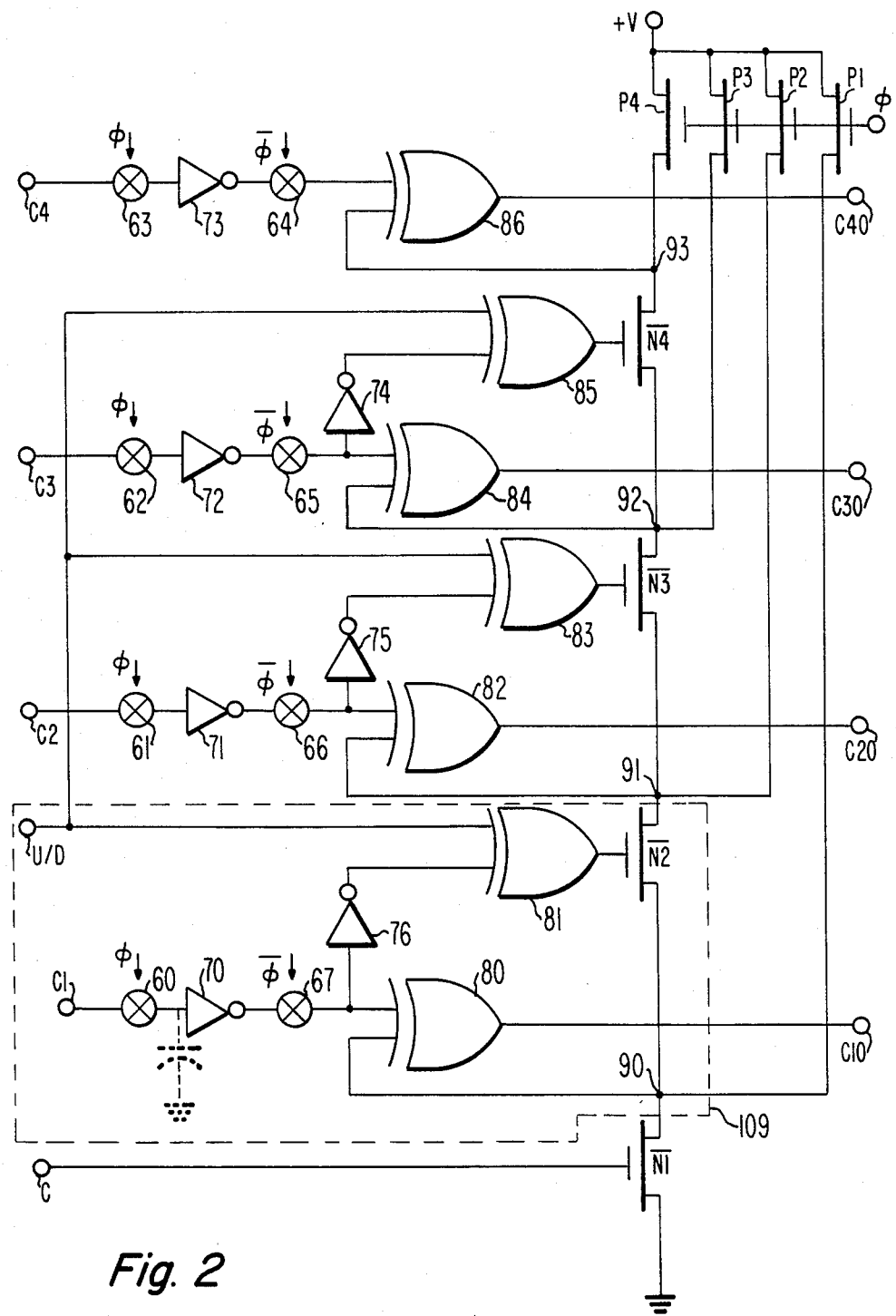
FIG. 2 is a partial block-partial schematic diagram of an up/down COUNTER circuit which may be implemented in the FIG. 1 filter.

Referring now to FIG. 2, there is shown a COUNTER circuit which may be more practically implemented into an FIR filter in integrated form. The FIG. 2 COUNTER responds directly to a count and "sign" bit signals and includes circuitry for providing the delay function of circuit elements 13–14 in FIG. 1.

In the FIG. 2 circuit the value of a preset count or number is applied in binary form to terminals C1–C4 with the MSB's applied in descending order to terminals C4, C3, etc. The count or number resident in the COUNTER is available at terminals C10–C40 in binary form with the MSB at terminal C40. The overflow or count signal is applied to terminal C to initiate an increment/decrement to the preset number. The "sign" bit is applied to the terminal designated U/D for determining whether the count should be up or down. A logic low (high) applied to the U/D terminal conditions the circuit to count up (down).

Circuit elements 60–67 are transmission gates which are conditioned to conduct by the respective clock signals $\phi$ or $\bar\phi$ applied thereto and are substantially open circuits otherwise. Transmission gates 60–63 conduct alternately with transmission gates 64–67 so that at no time is there a closed conduction path through any of the serially connected pairs of transmission gates (60, 67), (61, 66), etc.

The circuit elements 70–74 are inverting buffers, presumed to have relatively high input impedance as for example CMOS inverters comprising serially connected pairs of P and N-type MOS transistors. Associated with the input terminal of each inverter is a finite inherent stray capacitance; the buffer input impedance and stray capacitance exhibit a time constant which is long relative to the delay between successive input samples $x_n$.

The serially connected transmission gates and buffer circuits (60, 70), (61, 71), etc. form respective dynamic latch circuits. Application of a high clock signal $\phi$ to transmission gates 60–63 conditions them to conduct the binary signals on terminals C1–C4 to the input terminals of the respective buffers 70–73. When $\phi$ goes low the binary signals remain stored on the inherent capacitances asociated with the input terminals of the buffers until gates 60–63 are again conditioned to conduct by the next successive $\phi$ clock pulse. Buffers 70–73 produce signals at their respective output terminals which are the complements of the logic levels stored at their respective input terminals. Subsequent to clock $\phi$ going low, clock $\bar\phi$ goes high conditioning transmission gates 64–67 to pass the signals present at the output terminals of the buffers 73–70, to the input terminals of buffers 74–76 and one input terminal of respective exclusive OR gates 80, 82, 84 and 86. The exclusive OR gates are also presumed to exhibit relatively high input impedance so that when transmission gates 64–67 are turned off the signal will remain stored on the inherent capacitances associated with the input terminals for a delay period commensurate with the delay provided by the delay elements 10–12 of FIG. 1. It should be noted, however, that for slow sample rates or long delay times it may be necessary to augment the inherent capacitances associated with the buffer and exclusive OR input terminals with auxiliary capacitors to extend the storage time.

The second input terminal of exclusive OR gate 80 is connected to the output terminal 90 of a clocked inverter comprising the serial connection of P-type transistor P1 and N-type transistor N1. Connection 90 is precharged to positive potential via transistor P1 when clock $\phi$ is low. The positive potential is stored on stray capacitances associated with connection 90 unless transistor N1 is conditioned to conduct. Transistor N1 having its gate electrode connected to terminal C conducts whenever the count signal is high. Thus connection 90 remains high if terminal C is low and goes low when terminal C is high. The output C10 of exclusive OR gate 80 is described by the Boolean equation $$C10 = C1\bar{C} + \bar{C1}C \tag{2}$$

where C and C10 are the logic states at terminals C and C10 respectively and C1 is the logic state of the lastmost preset count bit transmitted from terminal C1 to the input of exclusive OR gate 80, via transmission gates 60 and 67. More properly if the current state of terminal C1 is defined $C1_n$ then the current state at the OR 80 and INVERTER 76 common input terminal is $C1_{n-1}$ where the n−1 subscript indicates a one sample delay. However, in order not to generate overly confusing equations with excess subscripts, the state values in the equations will be written C1, C2, etc. and it is implicit that these terms are in fact the states of the previous count bits delayed one clock period ($\phi$). From equation (2) it can be seen that if the count signal is low the preset bit is passed directly to the output terminal. If the count signal is high a "1" is added base 2 to the preset number C1.

Exclusive OR gate 82 has its second input terminal connected to the output connection of a clocked quasi NAND structure comprising the serial connection of P-type transistor P2 and N-type transistors N1 and N2. Transistor P2 precharges connection 91 to a high state when the clock $\phi$, applied to its gate electrode is low. Connection 91 remains in the high state unless both transistors N1 and N2 are conditioned to conduct. As indicated above transistor N1 is responsive to the count signal. Transistor N2, on the other hand, is conditioned to conduct depending upon the states of the "sign" bit (up/down control signal) and the least significant bit (LSB) of the preset number, i.e., C1. The gate of transistor N2 is coupled to the output terminal of exclusive OR gate 81 having input terminals connected for receiving the "sign" bit (U), i.e., U/D in the figure and the LSB C1 respectively. As such the condition for N2 to conduct is defined by $$N2_{on} = U\overline{C1} + \overline{U}C1 \quad (3)$$

The condition for connection 91 to go low is therefore described by:

$$91_{low} = C(U\overline{C1} + \overline{U}C1) \quad (4)$$

and $$91_{high} = \overline{C} + \overline{U}\,\overline{C1} + UC1 \quad (5)$$

Using equations (4) and (5) the output state C20 of terminal C20 can be defined by $$C20\uparrow = C2\overline{U}\,\overline{C1} + \overline{C2}CU\overline{C1} + C2\overline{C} \quad (6)$$

and $$C20\downarrow = C2U\overline{C1} + \overline{C2}CUC1 + C2\overline{C} \quad (7)$$

where C20 ↑ and C20 ↓ are the output states for the count up and count down modes respectively. Again it will be noted that if the count signal is low the preset value C2 is translated unchanged to the output terminal C20.

Similarly the output state at terminal C30 is dependent upon the preset state C3 and the conduction states of transistors N1, N2 and N3. C40 is similarly dependent on the preset state C4 and the conduction state of transistors N1, N2, N3 and N4. The Boolean equations defining C30 and C40 are given by:

$$C30\uparrow = \overline{C3}CU\overline{C1}\,\overline{C2} + C3\overline{U}(C1+C2) + C3\overline{C} \quad (8)$$

$$C30\downarrow = \overline{C3}CUC1C2 + C3U(C1+C2) + C3\overline{C} \quad (9)$$

$$C40\uparrow = \overline{C4}CU\overline{C1}\,\overline{C2}\,\overline{C3} + C4\overline{U}(C1+C2+C3)\overline{C}4\overline{C} \quad (10)$$

$$C40\downarrow = \overline{C4}CUC1C2C3 + C4U(C1+C2+C3) + C4\overline{C} \quad (11)$$

where the arrows ↑ ↓ respectively denote counting in the up or down mode as determined by the state of the "sign" bit U.

FIG. 3 is a state table for the circuit of FIG. 2 generated from equations (2), (6), (7), (8), (9), (10), and (11). Columns C, C1–C4, depict all possible states of the count signal and the preset values respectively. The four rightmost columns C10–C40 indicate the resultant output states at terminals C10–C40 for the up/down or sign bit U being high or in the count down mode and the center four columns designated C40–C10 are the output states for the control bit being low or in the count up mode. From the table it becomes apparent that when the count signal C is low, the circuitry between the preset values, C1–C4, and the output terminal, C10–C40 is transparent i.e. the states at terminals Ci are translated unchanged to corresponding terminals Cio. On the other hand when the count signal C is high the circuit performs an increment or decrement to the preset value depending on the "sign" bit U being low or high respectively. Not in two's complement notation, the "sign" bit of a positive or negative number is low and high respectively.

A word of clarification is in order at this point. Those skilled in the art of two's complement arithmetic will realize that an overflow or "carry out" (count signal) for a negative number is a logic "zero" while the carry out for a positive number is a "one". The table in FIG. 3 presumes that the carry bit C is a "one" for both positive and negative overflows. This condition is easily obtained by the circuit shown in FIG. 4B which may be included as part of the COUNTER circuit or incorporated in the respective ADDER circuits.

Figure 4A:
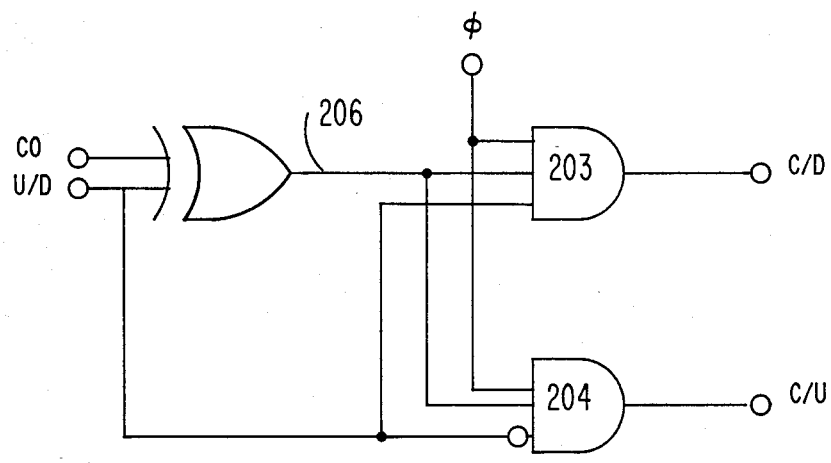
FIGS. 4A and 4B are schematic diagrams of circuitry for converting the logical "0" manifestation of negative, two's complement overflows to a logical "1" manifestation and circuitry for combining sign bit and overflow bit signals to generate count up clock signals and count down clock signals.
Figure 4B:
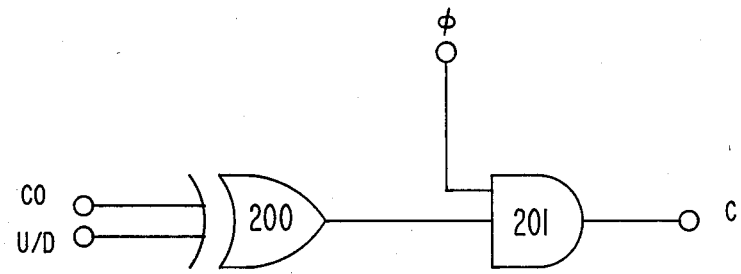

In FIG. 4B the carry out signal C0 ("1" for a positive number and "0" for a negative number) from a conventional ADDER circuit is applied to one input of exclusive OR circuit 200. The "sign" bit signal U/D is applied to the second input terminal of exclusive OR circuit 200. The output signal from OR circuit 200 is a "1" when C0 is low and U/D high to indicate a carry out for a negative number and is also a "1" when C0 is high and U/D is low to indicate a carry out for a positive number to satisfy the criteria of the state table. The output signal from exclusive OR gate 200 is ANDED with the system clock φ in AND circuit 201 to synchronize the count signal C so that trnasistor N1 will not conduct when the precharging transistors P1–P4 are conducting.

The count up C/U and count down C/D signals referred to with respect to FIG. 1 may be similarly generated by the circuit illustrated in FIG. 4A.

In FIG. 4A the carry out signal, C0, and sign bit signal U/D from a conventional ADDER circuit are applied to the input terminals of exclusive OR gate 205 producing a signal at connection 206 which is positive, i.e., a "1" for positive or negative overflows. This signal is applied to respective first input terminals of AND gates 203 and 204. The "sign" signal U/D is applied to a second input terminal of AND gate 203 and to an inverting input terminal of AND gate 204. The system clock φ is applied to respective third terminals of AND gates 203 and 204 to synchronize the C/D and C/U signals with the remaining filter circuitry. Following the conventional rules of combinatorial logic, AND 203 will generate a "1" at its output terminal C/D for U/D "high", φ "high" and C0 "low" and a "zero" state otherwise. AND gate 204 will generate a "1" at its output terminal C/U for U/D "low", C0 "high" and φ "high". Thus, C/D produces a positive pulse for a negative overflow and C/U also produces a positive pulse for a positive overflow.

What is claimed is:

1. A sampled data input weighted FIR filter of the type including alternately connected ADDER circuits and delay stages in a serial chain wherein input samples are multiplied by coefficients and applied in parallel to said ADDER circuits for addition therein to sums from preceding ADDER circuits stored in said delay stages and wherein said ADDER circuits are subject to sum overflows; respective COUNTER circuits are coupled to each ADDER circuit to respond to sum overflows, said COUNTER circuits being serially connected one to another by delay stages wherein the overflow count of each counter is translated to a successive counter in consonance with the sum in the ADDER circuit coupled to the respective counter being translated to a successive ADDER circuit coupled to said successive counter, each counter adding to the count therein provided from the previous counter a value corresponding to the overflow condition of the ADDER circuit to which it is coupled, the last COUNTER circuit containing the net number of overflows corresponding to the output sum of said ADDERS, which overflow signal is indicative of the state of correctness of the output sample of said ADDERS.

2. A sampled data FIR filter comprising:
a first terminal for applying a sampled data signal thereto;
a plurality of multiplier circuits for multiplying the sampled data signal by respective coefficients $a_i$, each of said multiplier circuits having an input terminal connected to said first terminal, and having an output terminal;
a first plurality of delay elements having respective input and output terminals;
a plurality of ADDER circuits each having first and second input terminals for applying two sampled data signals to be added, having respective SUM, CARRY OUT and SIGN output terminals;
means for connecting the first input terminals of said plurality of ADDER circuits to respective output terminals of said multiplier circuits;
means for connecting the second input and SUM terminals of respective ADDER circuits to the output and input terminals of successive ones of said delay elements to form a first serial chain of alternating delay elements and ADDER circuits with the SUM terminal of the lastmost ADDER circuit in the chain providing an output signal for said FIR filter;
a plurality of presettable up/down COUNTER circuits each having binary preset input terminals, binary output terminals and counting control input terminals;
means for connecting the CARRY OUT and SIGN output terminals of respective ADDER circuits to the counting control input terminals of respective counter circuits for causing said COUNTER circuits to increment or decrement a respective count therein in response to positive or negative ADDER overflows respectively;
a second plurality of delay elements having respective input and output terminals connected between the binary output and binary preset input terminals of successive COUNTER circuits forming a serial chain of alternating COUNTER and delay elements and wherein signal from the binary output terminals of the lastmost COUNTER in said serial chain, which counter is connected to said lastmost ADDER circuit in said first serial chain, corresponds to the net number of overflows produced by said plurality of ADDER circuits in processing the signal sample currently available at the output terminals of said lastmost ADDER circuit.

3. The FIR filter set forth in claim 2 wherein said MULTIPLIER circuits are of the shift and add type and include overflow output terminals, said filter further comprising:
means for detecting when signal applied to said first terminal exceeds a predetermined range, said means including an OR gate having an output and N input terminals where N is an integer; and
means for connecting said N input terminals to the respective overflow output terminals of N of said MULTIPLIER circuits.

4. In a sampled data FIR filter of the type including a serial chain of alternating delay elements and ADDER circuits, each adder producing a sum signal which is delayed and transferred to a subsequent ADDER in said chain via respective delay elements and whereas a portion of current sampled data signal is added thereto, and wherein said ADDER circuits are susceptible to overflow in both the positive and negative direction, circuitry for determining the net number of overflows occurring in said ADDER circuits associated with each signal sample comprising:
a plurality of up/down COUNTER circuits coupled to respective ADDER circuits susceptible to SUM overflow, said COUNTER circuits respectively responsive to said SUM overflow for incrementing or decrementing a count value therein;
a plurality of delay elements serially connecting said COUNTER circuits in a further chain for delaying and transferring the count present in the respective COUNTER circuits to succeeding COUNTER circuits in consonance with corresponding SUMS being delayed and transferred to corresponding ADDER circuits in said serial chain and wherein the count in the lastmost COUNTER of said further chain is representative of the net number of overflows associated with the SUM in the lastmost ADDER circuit of said serial chain.

5. The FIR filter set forth in claim 4 wherein the plurality of up/down COUNTER circuits is of like number to the number of ADDER circuits in said serial chain.

6. The FIR filter set forth in claim 4 or 5 wherein each up/down COUNTER circuit increments or decrements the count therein by at most one, in response to each addition performed by the respective ADDER circuit coupled thereto.

7. The FIR filter set forth in claim 4 or 5 wherein each COUNTER provides a binary manifestation of the count therein and further comprises:
means coupled to the lastmost COUNTER circuit for detecting when the binary manifestation of the count therein represents zero net overflows in said ADDER circuits.

* * * * *

UNITED STATES PATENT AND TRADEMARK OFFICE
CERTIFICATE OF CORRECTION

PATENT NO. : 4,507,725

DATED : Mar. 26, 1985

INVENTOR(S) : Lauren A. Christopher; David L. Sprague

It is certified that error appears in the above-identified patent and that said Letters Patent is hereby corrected as shown below:

Column 1, line 43  "x" should be $--x_n--$.

Column 5, line 47  "$\phi$", second occurrence thereof, should be $--\overline{\phi}--$.

Column 6, line 6  "$\phi$" should be $--\overline{\phi}--$.

Column 6, line 36  "C10=C1C+C1C" should be $--C10=\overline{C1}C+C1\overline{C}--$.

Column 7, line 6  "$N2_{on}$=UC1+UC1" should be $--N2_{on}=\overline{U}C1+U\overline{C1}--$.

Column 7, line 11  "$91_{low}$=C(UC1+UC1)" should be $--91_{low}=C(\overline{U}C1+U\overline{C1})--$.

Column 7, line 14  "$91_{high}$=C+UC1+UC1" should be $--91_{high}=\overline{C}+\overline{U}\overline{C1}+UC1--$.

UNITED STATES PATENT AND TRADEMARK OFFICE
CERTIFICATE OF CORRECTION

PATENT NO. : 4,507,725

DATED : Mar. 26, 1985

INVENTOR(S) : Lauren A. Christopher; David L. Sprague

It is certified that error appears in the above-identified patent and that said Letters Patent is hereby corrected as shown below:

Column 7, line 19    "$C2O{\uparrow}=C2UC1+C2CUC1+C2C$" should be $--C2O{\uparrow}=C2\overline{UC1}+\overline{C2}c\overline{U}C1+C2\overline{C}--$.

Column 7, line 23    "$C2O{\downarrow}=C2UC1+C2CUC1+C2C$" should be $--C2O{\downarrow}=C2UC1+\overline{C2}cU\overline{C1}+C2\overline{C}--$.

Column 7, line 37    "$C3O{\uparrow}=C3CUC1C2+C3U(C1+C2)+C3C$" should be $--C3O{\uparrow}=\overline{C3}c\overline{U}C1C2+C3\overline{U}(\overline{C1}+\overline{C2})+C3\overline{C}--$.

Column 7, line 39    "$C3O{\downarrow}=C3CUC1C2+C3U(C1+C2)+C3C$" should be $--C3O{\downarrow}=\overline{C3}cU\overline{C1C2}+C3U(C1+C2)+C3\overline{C}--$.

Column 7, line 41    "$C4O{\uparrow}=C4CUC1C2C3+C4U(C1+C2+C3)C4C$" should be $--C4O{\uparrow}=\overline{C4}c\overline{U}C1C2C3+C4\overline{U}(\overline{C1}+\overline{C2}+\overline{C3})C4\overline{C}--$.

Column 7, line 43    "$C4O{\downarrow}=C4CUC1C2C3+C4U(C1+C2+C3)+C4C$" should be $--C4O{\downarrow}=\overline{C4}cU\overline{C1C2C3}+C4U(C1+C2+C3)+C4\overline{C}--$.

Column 7, line 64    "Not" should be --Note--.

Column 8, line 44    "$\phi$" should be $--\overline{\phi}--$.

Signed and Sealed this

Twenty-fourth Day of September 1985

[SEAL]

Attest:

DONALD J. QUIGG

Attesting Officer      Commissioner of Patents and Trademarks—Designate